United States Patent
Farinola et al.

(10) Patent No.: US 11,282,657 B2
(45) Date of Patent: Mar. 22, 2022

(54) DEVICE FOR CONTROLLING AND/OR SUPPLYING INFORMATION ON A RECHARGING OPERATION OF AN ELECTRIC MOTOR-VEHICLE OR A HYBRID MOTOR-VEHICLE

(71) Applicant: TE Connectivity Italia Distribution S.r.l., Turin (IT)

(72) Inventors: Marcello Farinola, Turin (IT); Cinzia Alferi, Turin (IT); Arianna Spolverato, Turin (IT); Claudia Cezza, Turin (IT); Alessandro Genta, Turin (IT)

(73) Assignee: TE Connectivity Italia Distribution S.r.l., Turin (IT)

( * ) Notice: Subject to any disclaimer, the term of this patent is extended or adjusted under 35 U.S.C. 154(b) by 0 days.

(21) Appl. No.: 17/016,729

(22) Filed: Sep. 10, 2020

(65) Prior Publication Data

US 2021/0074491 A1     Mar. 11, 2021

(30) Foreign Application Priority Data

Sep. 10, 2019  (IT) .................... 102019000015983

(51) Int. Cl.
| | |
|---|---|
| *H01H 13/14* | (2006.01) |
| *H01H 11/00* | (2006.01) |
| *H01H 13/04* | (2006.01) |
| *H05K 3/30* | (2006.01) |
| *H05K 7/14* | (2006.01) |
| *B60L 53/60* | (2019.01) |

(52) U.S. Cl.
CPC ............ *H01H 13/14* (2013.01); *H01H 11/00* (2013.01); *H01H 13/04* (2013.01); *H05K 3/303* (2013.01); *H05K 7/1427* (2013.01); *B60L 53/60* (2019.02)

(58) Field of Classification Search
CPC .......... H01H 13/14; H01H 11/00; H01H 13/04
USPC ......................................................... 200/341
See application file for complete search history.

(56) References Cited

U.S. PATENT DOCUMENTS

| | | | |
|---|---|---|---|
| 5,530,621 A | 6/1996 | Choy | |
| 5,593,319 A * | 1/1997 | Ohno | ................. H01R 13/5219 439/587 |
| 7,044,773 B2 | 5/2006 | Suzuki et al. | |

(Continued)

FOREIGN PATENT DOCUMENTS

WO     2016038559 A1     3/2016

OTHER PUBLICATIONS

Italian Search Report, dated May 18, 2020, 10 pages.

*Primary Examiner* — Edwin A. Leon
*Assistant Examiner* — Iman Malakooti
(74) *Attorney, Agent, or Firm* — Barley Snyder (57) ABSTRACT

A device for controlling and/or supplying information on a recharging operation of an electric motor vehicle or a hybrid motor vehicle includes a casing, a printed circuit board mounted within the casing, and a human-machine interface associated with the casing. The human-machine interface includes a push-button switching device having an on/off button, having a push-button body, carrying at least one electric contact, arranged within the casing, and having a portion mounted to the printed circuit board. The push-button switching device has an arm protruding from the push-button body. The arm abuts against an abutment wall arranged within the casing when the on/off button is pressed.

19 Claims, 8 Drawing Sheets

(56) References Cited

U.S. PATENT DOCUMENTS

| | | | |
|---|---|---|---|
| 7,579,568 B2* | 8/2009 | Nakade | H01H 9/30 200/341 |
| 7,997,914 B2 | 8/2011 | Bychkov et al. | |
| 2012/0199461 A1* | 8/2012 | Shim | B60R 25/00 200/52 R |
| 2015/0056845 A1 | 2/2015 | Tanaka | |
| 2015/0255234 A1 | 9/2015 | Matsumoto | |

* cited by examiner

DEVICE FOR CONTROLLING AND/OR SUPPLYING INFORMATION ON A RECHARGING OPERATION OF AN ELECTRIC MOTOR-VEHICLE OR A HYBRID MOTOR-VEHICLE

CROSS-REFERENCE TO RELATED APPLICATION

This application claims the benefit of the filing date under 35 U.S.C. § 119(a)-(d) of Italian Patent Application No. 102019000015983, filed on Sep. 10, 2019.

FIELD OF THE INVENTION

The present invention relates to a device for controlling and/or supplying information on an electric motor vehicle or a hybrid motor vehicle and, more particularly, to a device for controlling and/or supplying information on a recharging operation of an electric motor vehicle or a hybrid motor vehicle.

BACKGROUND

A device for controlling and/or supplying information on a recharging operation of an electric motor vehicle or a hybrid motor vehicle is typically difficult to use and is unreliable in use. The devices commonly have a bulky structure requiring lengthy times for assembly and installation on the motor vehicle, and frequently suffer from operating anomalies during the life cycle of a motor vehicle on which the device is installed.

SUMMARY

A device for controlling and/or supplying information on a recharging operation of an electric motor vehicle or a hybrid motor vehicle includes a casing, a printed circuit board mounted within the casing, and a human-machine interface associated with the casing. The human-machine interface includes a push-button switching device having an on/off button, having a push-button body, carrying at least one electric contact, arranged within the casing, and having a portion mounted to the printed circuit board. The push-button switching device has an arm protruding from the push-button body. The arm abuts against an abutment wall arranged within the casing when the on/off button is pressed.

BRIEF DESCRIPTION OF THE DRAWINGS

The invention will now be described by way of example with reference to the accompanying Figures, of which.

DETAILED DESCRIPTION OF THE EMBODIMENT(S)

In the following description, various specific details are illustrated aimed at a thorough understanding of examples of one or more embodiments. The embodiments can be implemented without one or more of the specific details, or with other methods, components, materials, etc. In other cases, known structures, materials, or operations are not shown or described in detail to avoid obscuring various aspects of the embodiments.

The reference to "an embodiment" in the context of this description indicates that a particular configuration, structure or characteristic described in relation to the embodiment is included in at least one embodiment. Therefore, phrases such as "in an embodiment", possibly present in different places of this description do not necessarily refer to the same embodiment. Moreover, particular conformations, structures or characteristics can be combined in a suitable manner in one or more embodiments and/or associated with the embodiments in a different way from that illustrated here, for example, a characteristic here exemplified in relation to a figure may be applied to one or more embodiments exemplified in a different figure. The references illustrated here are only for convenience and do not therefore delimit the field of protection or the scope of the embodiments.

In the attached drawings, the reference D indicates—in its entirety—an embodiment of a device for controlling and/or supplying information on a recharging operation of an electric motor vehicle or a hybrid motor vehicle, which can be mounted on the motor vehicle and associable with an inlet electric connector assembly for recharging the motor vehicle.

Figure 1:
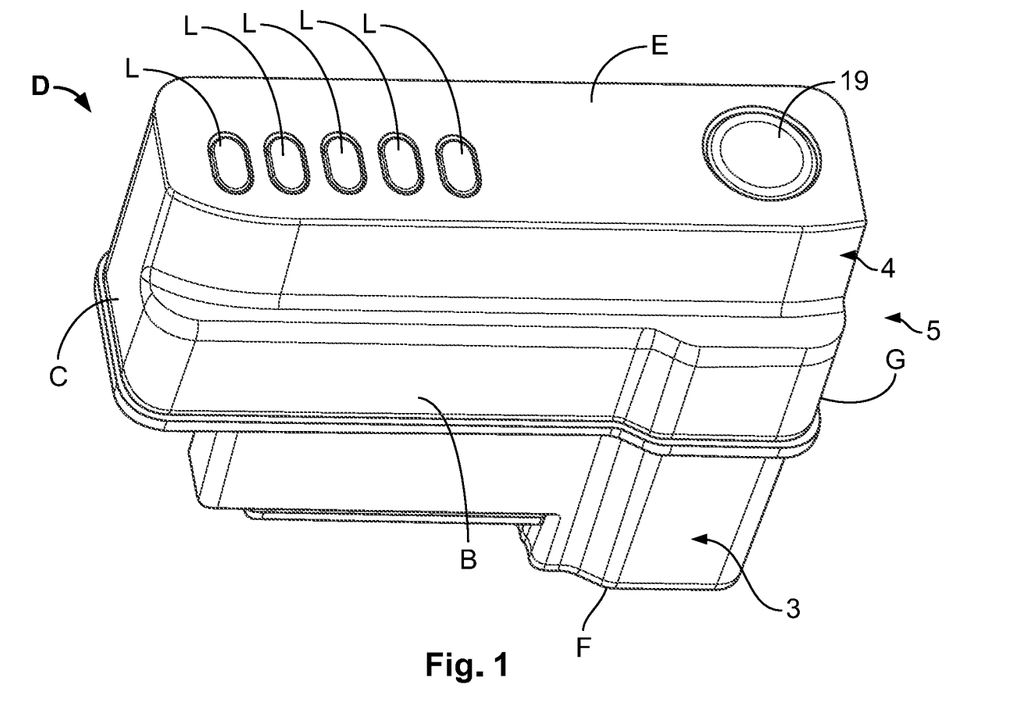
FIG. 1 is a perspective view of a device according to an embodiment.
Figure 2:
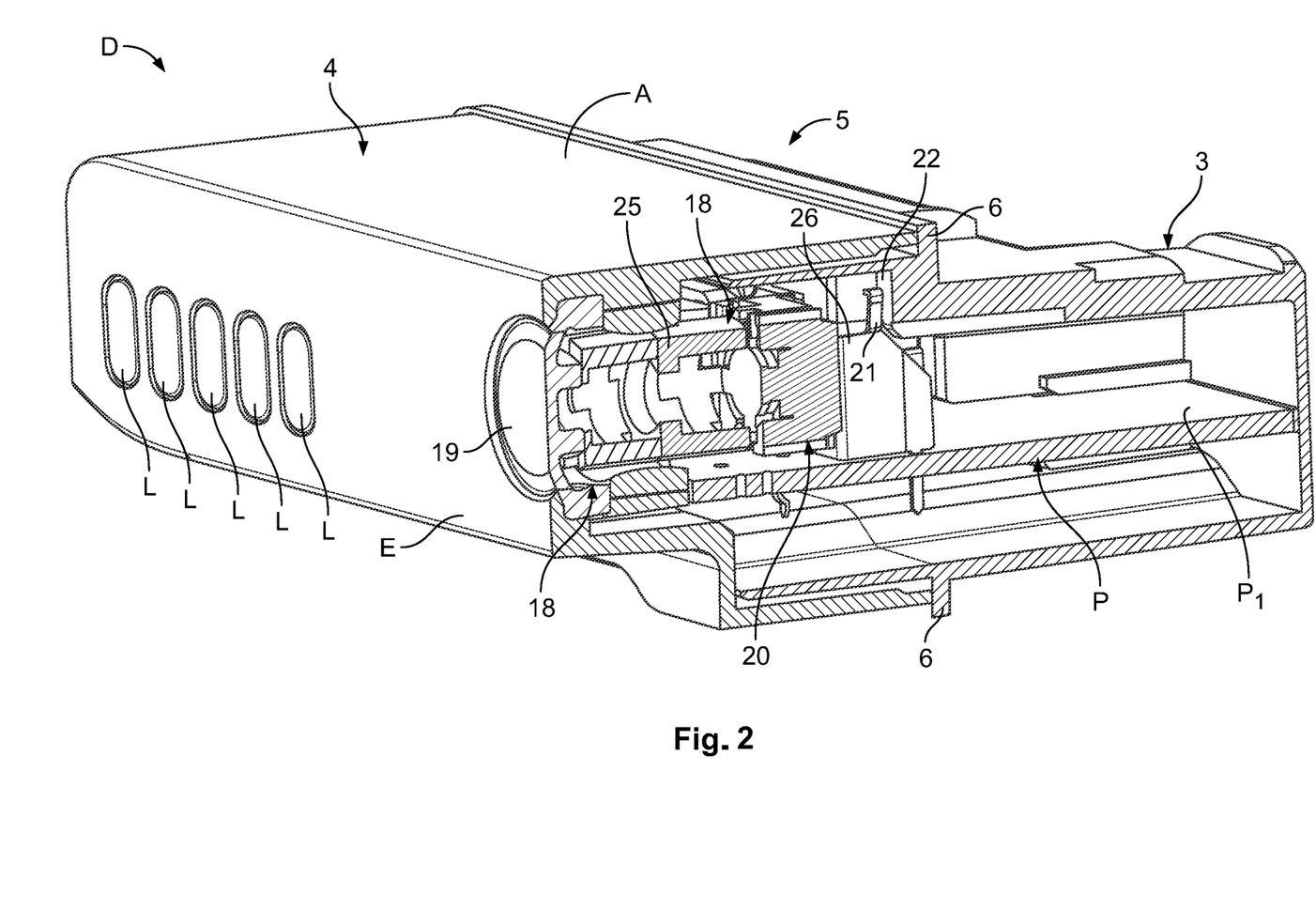
FIG. 2 is a sectional perspective view of the device of FIG. 1.

As shown in FIGS. 1 and 2, the device D has a casing 5 of a substantially prismatic shape, which defines an upper wall A, a lower wall B, opposite side walls C, G, a front wall E and a rear wall F.

Figure 10:
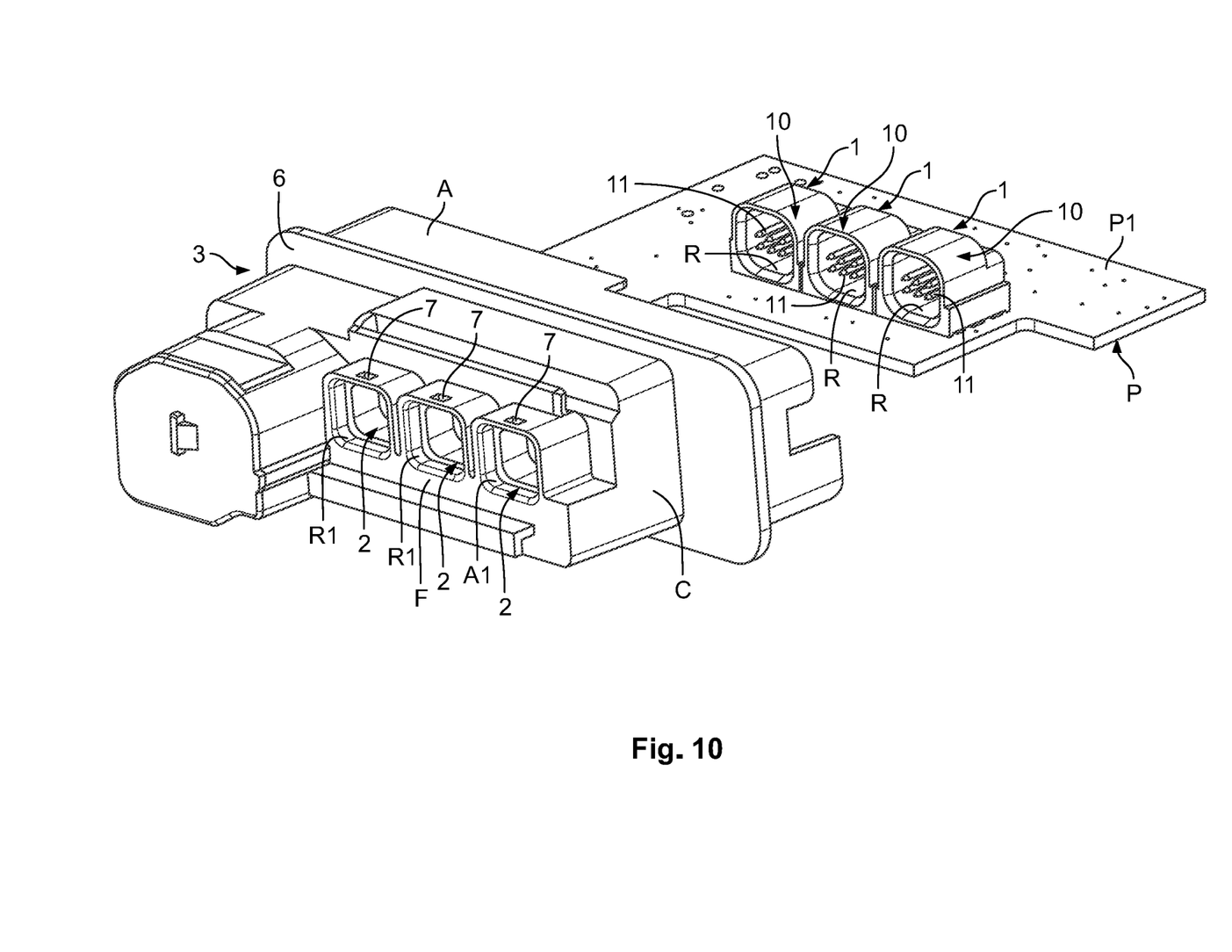
FIG. 10 is an exploded perspective view of a miniaturized connector system according to an embodiment.

A printed circuit board P is mounted inside the casing 5, the board P having a main side P1 on which a plurality of components are mounted, as shown in FIGS. 2 and 10. Details relating to these components are indicated in the description below.

The device D comprises a human-machine interface HMI associated with the casing 5, to allow a user to control a recharging process of a battery pack of the motor vehicle, on which the device D is installed. As shown in FIGS. 1 and 2, the interface includes a push-button switching device 18 comprising an on/off button 19. In the example illustrated in the drawings, the on/off button 19 is arranged at the front wall E of the casing 5. Purely by way of example, with the push-button 19, it is also possible to create a series of auxiliary functions, in addition to switching on/off of the device D, such as programming the start time of the recharging step.

As shown in FIG. 1, at the front wall E, next to the push-button 19, there are a plurality of warning lights L, which light up progressively during recharging of the vehicle, to display the battery recharge status of the motor vehicle. Of course, the configuration of the interface illustrated in the attached drawings, in particular in FIG. 1, is given here purely by way of example.

In one or more embodiments, as shown in FIGS. 1 and 2, the casing 5 of the device D is defined by a first support body 3, configured to support the printed circuit board P, and a second support body 4, bearing the front wall E with the push-button 19. The first and the second support bodies 3, 4 are rigidly connected to each other, so as to create the casing 5 indicated above.

In an embodiment, the first and second supporting bodies 3, 4 are welded together by a laser welding process. As shown in FIG. 2, the first support body 3 has a thickness 6 protruding from the upper A, lower B and side C, G walls of the first support body 3, along a direction perpendicular to these, arranged to be joined to a corresponding front surface of the second support body 4, so as to create a single hollow casing 5 inside which all the components of the device D are arranged. Of course, the casing 5 can be made according to other construction techniques, materials and conformations, which differ from that indicated above, without departing from the scope of the present invention.

As indicated above and shown in FIG. 2, the device D includes a human-machine interface HMI having a push-button switching device 18, and a printed circuit board P mounted within the casing 5. The push-button switching device 18, in addition to the push-button 19, comprises a push-button body 20 arranged inside the casing 5. The push-button body 20 has at least one portion mounted on the printed circuit board P, and carries at least one electrical contact for transmitting a pulse to the printed circuit board P, so as to activate the device D. More particularly, the push-button body 20 has a tubular-shaped first portion 25 made of plastic material, having a first end connected to the push-button 19.

Figure 3:
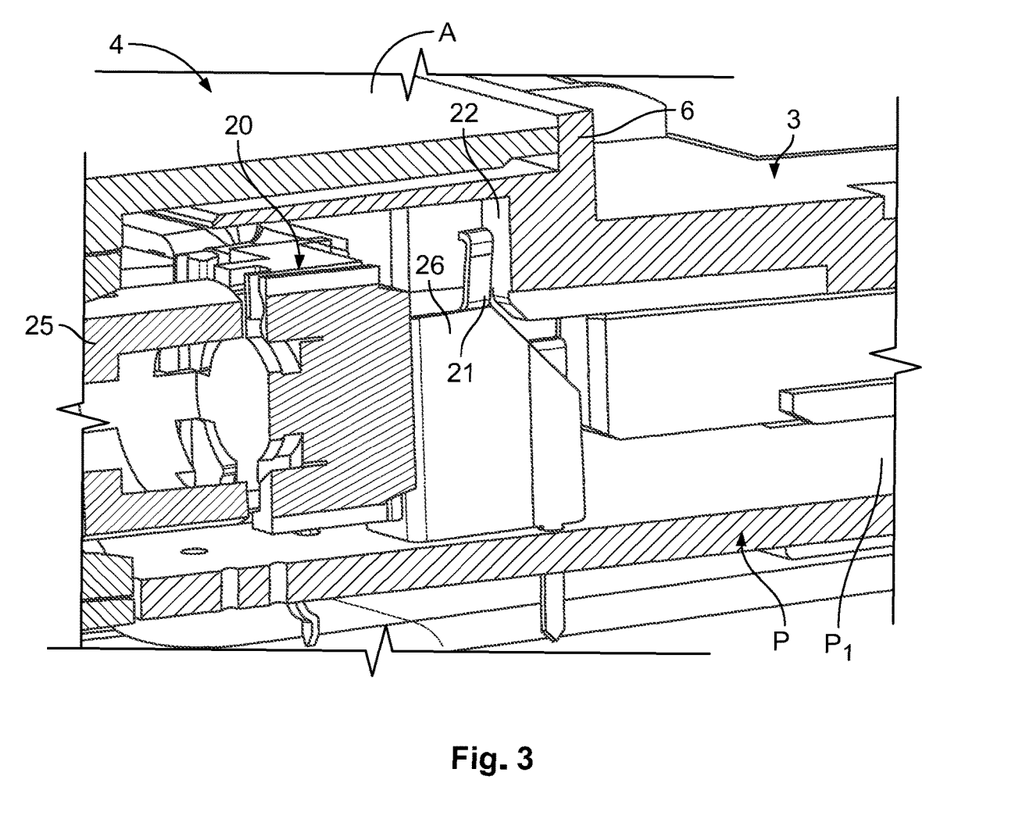
FIG. 3 is a detail view of a portion of FIG. 2.

As shown in FIG. 3, the push-button body 20 also has a second portion 26 of conductive material, having a first end connected to the tubular portion 25 of plastic material and a second end welded to the printed circuit board P. After the on/off button 19 is pressed, the push-button body 20 moves along an operating direction corresponding to the main axis of the push-button body 20, to transmit a pulse which, through the electrical terminals, activates the device D. The second portion 26 is mounted on the board P so as to allow micro-displacements of the push-button body 20 deriving from the pressure of the push-button 19. The push-button body 20 also comprises elastic element, which allow the push-button body 20 to be returned to its initial position.

As shown in FIGS. 2 and 3, the push-button switching device 18 also comprises an arm 21 protruding from the push-button body 20 which, in a pressed push-button condition, abuts against an abutment wall 22 arranged inside the casing 5. In the embodiment illustrated in the drawings, the abutment wall 22 is formed within the first support body 3, and is spaced apart perpendicularly to the main axis of the push-button body 20. Stress deriving from the pressure of the push-button 19 and the displacement of the push-button body 20 along its main axis is discharged onto the abutment wall 22 by the arm 21, thus preventing this stress from being discharged or transferred onto the printed circuit board P. It will therefore be appreciated that the device D is made in such a way as to avoid damage to the printed circuit board P, deriving from an excessive pressure on the push-button 19.

In one or more embodiments, as shown in FIGS. 2 and 3, the printed circuit board P is mounted inside the casing 5 along a horizontal direction, in such a way that the main plane of the board P is perpendicular to the front and rear walls E, F of the casing 5. The push-button body 20 extends within the casing 5 perpendicularly to the front and rear walls E, F of the casing 5, near the main side P1 of the board P.

As shown in FIGS. 2 and 3, the arm 21 protrudes from the push-button body 20 (more particularly from the portion 26 of conductive material) in the opposite direction with respect to the printed circuit board P, perpendicularly to the main axis of the push-button body 20. The arm 21 has a main plane substantially perpendicular to the abutment wall 22, in such a way that, in the pressed condition of the push-button 19, one side of the arm 21 abuts against the abutment wall 22, which is arranged perpendicularly to the main axis of the push-button body 20.

Figure 4:
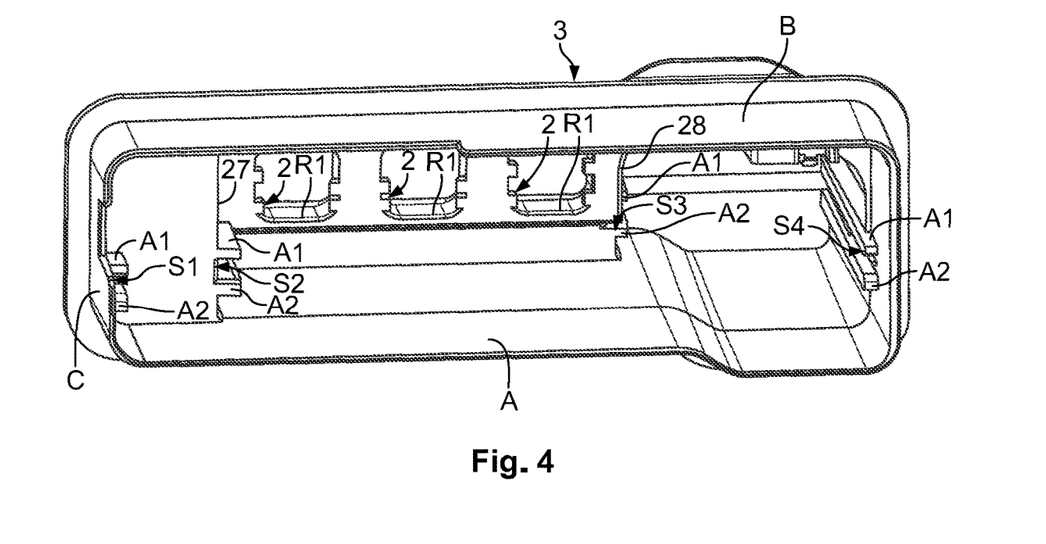
FIG. 4 is a perspective view of first support body of a casing of the device.

The casing 5 includes a plurality of grooves S1, S2, S3, S4, therein, as shown in FIG. 4, to lock the printed circuit board P in position within the casing 5. In the shown embodiment, the board P is locked horizontally, in such a way that its main plane is perpendicular to the front and rear walls E, F of the casing 5. The casing 5 of the device D is defined by a first support body 3, configured to support the printed circuit board P, and a second support body 4, bearing the front wall E with the push-button 19.

Figure 5:
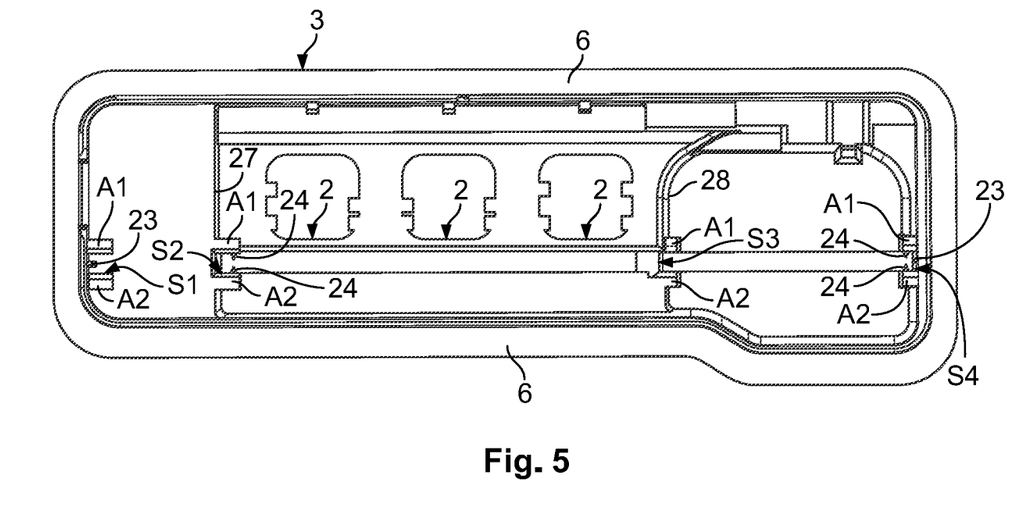
FIG. 5 is a front view of the first support body.

FIGS. 4 and 5 show, respectively, a perspective view and a front view of the first support body 3 carrying the grooves S1, S2, S3, S4. In an embodiment, each groove S1, S2, S3, S4 is defined by a pair of fins including an upper fin A1 and a lower fin A2 spaced apart vertically from each other, to retain, respectively, a portion of the printed circuit board P. In the shown embodiment, the main side P1 of the printed circuit board P is in contact with the upper fins A1, while a secondary side of the printed circuit board P is in contact with the lower fins A2. In various embodiments, including the shown embodiment, the plurality of grooves includes two end grooves S1, S4 each arranged at the inner surface of a respective side wall C, G of the casing 5, and two intermediate grooves S2, S3, each arranged at a respective intermediate wall 27, 28 formed within the casing 5 between said side walls C, G, as shown in FIGS. 4 and 5. In the shown embodiment, the intermediate walls 27, 28 are substantially parallel to the side walls C, G of the casing 5. In an embodiment, the intermediate grooves S2, S3 both face one of the two end grooves S1, S4 and are arranged in positions progressively closer to the rear wall F of the casing 5.

Figure 6:
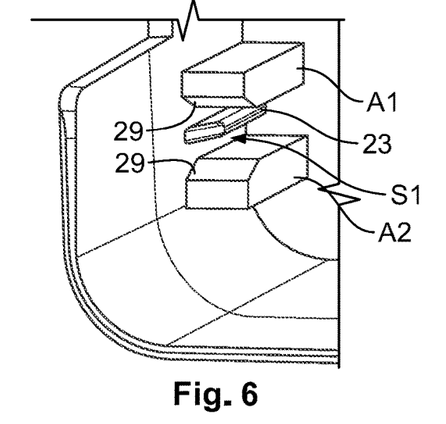
FIG. 6 is a detail perspective view of a portion of the first support body.

In an embodiment, as shown in FIGS. 5 and 6, a central rib 23 is formed between the upper and lower fins A1, A2 defining the end grooves S1, S4. The rib 23 extends longitudinally within the respective end groove S1, S4. The central ribs 23 are arranged to limit the movement of the printed circuit board P along a horizontal direction, perpendicular to the side walls C, G of the casing 5.

In the embodiment shown in FIG. 6, the upper and lower fins A1, A2 which define the outer grooves S1, S4 have a front beveled portion 29 configured for facilitating the insertion of the printed circuit board P within the grooves.

Figure 7:
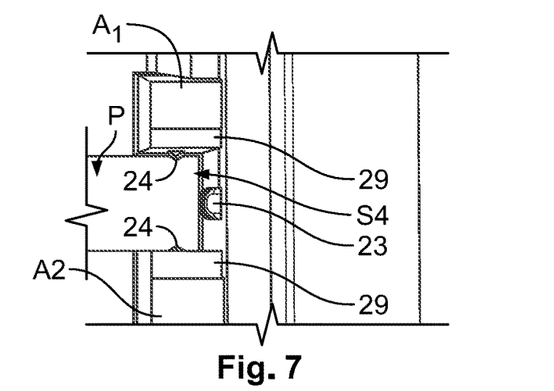
FIG. 7 is a detail perspective view of another portion of the first support body.
Figure 8:
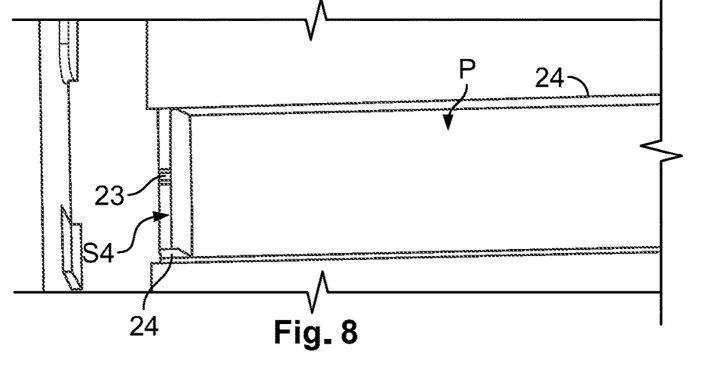
FIG. 8 is a detail perspective view of another portion of the first support body.

In an embodiment, as shown in FIGS. 5, 7, and 8, between the upper and lower fins A1, A2 defining one of the outer grooves S4, and between the upper and lower fins A1, A2 defining one of the intermediate grooves S2, two triangular ribs 24 are formed, facing each other and each arranged adjacent to a respective upper and lower fin A1, A2, to limit the movement of the printed circuit board P along a direction perpendicular to the front wall E of the casing 5.

Due to the characteristics of the grooves S1, S2, S3, S4, indicated above, the printed circuit board P is stably locked inside the casing 5, avoiding the risk of running into operating anomalies of any type (for example, detachment of the board P from its seats inside the casing 5, caused by vibrations deriving from the operating steps of a motor vehicle on which the device is installed).

In an embodiment, the device D comprises a miniaturized connector system. With reference, in particular, to the exploded perspective views of FIGS. 10 and 11, the miniaturized connector system includes one or more connector elements 1 mounted on the printed circuit board P. The connector element 1 can be welded or glued on the main side P1 of the board P. The connector element 1, rigidly connected to the printed circuit board P, comprises a main connector body 10 made of plastic material, which defines a receptacle R extending along a direction substantially parallel to the main plane of the printed circuit board P. In one or more embodiments, as shown in FIGS. 12 and 13, the main body 10 of the connector 1 can be cuboid-shaped, so as to define a bottom wall 14 of the receptacle R, substantially perpendicular to the main plane of the printed circuit board P.

Figure 11:
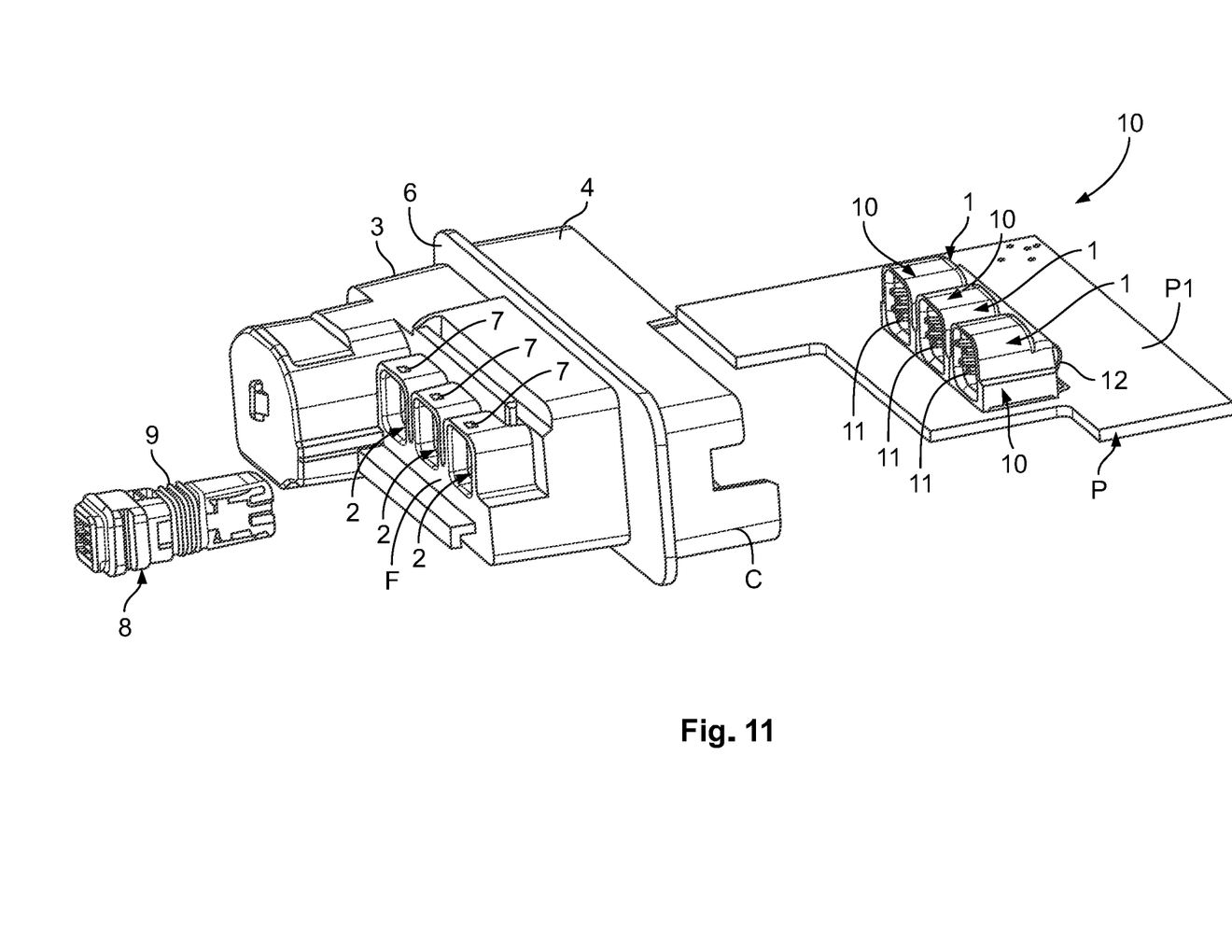
FIG. 11 is an exploded perspective view of the miniaturized connector system with a terminal of a cable.
Figure 12:
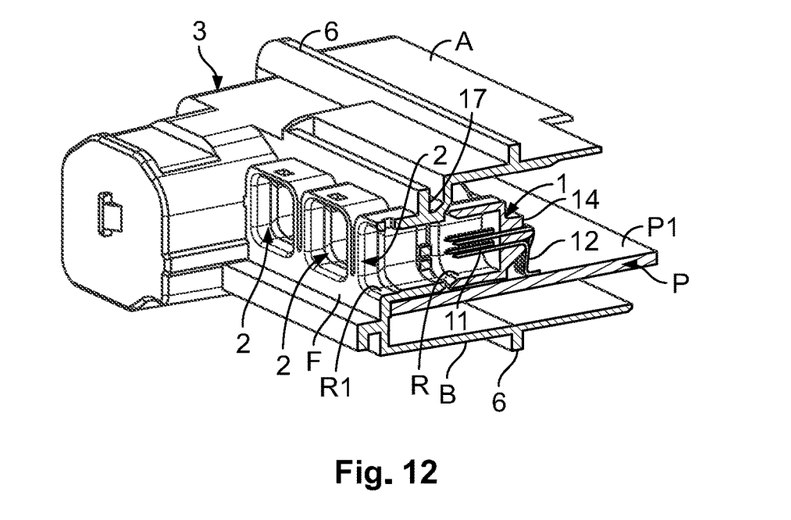
FIG. 12 is a sectional perspective view of the miniaturized connector system in an assembled condition.
Figure 13:
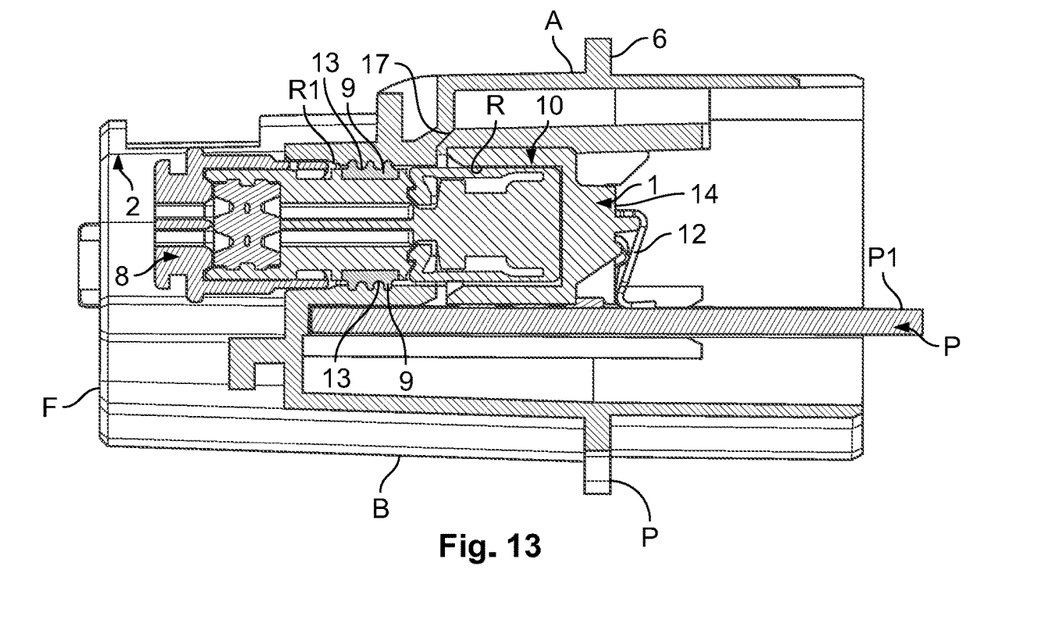
FIG. 13 is a sectional perspective view of the miniaturized connector system of FIG. 12 with the terminal of the cable.

The connector element 1 further comprises at least one metal terminal 11 arranged at least partially inside the receptacle R and electrically connected to the printed circuit board P, as shown in FIGS. 11-13. The metal terminals 11 are configured to cooperate with a terminal 8 of a cable connected to the connector element 1 and arranged within the receptacle R according to an operative connection direction parallel to the main plane of the printed circuit board P.

As shown in FIGS. 12 and 13, the metal terminals 11 each include a respective protruding portion 12 protruding from respective holes made on the bottom wall 14 of the receptacle R. In order to make the electrical connection with the printed circuit board P, the aforesaid protruding portions 12 are bent in the direction of the printed circuit board P and welded thereto, at its main side P1.

Figure 9:
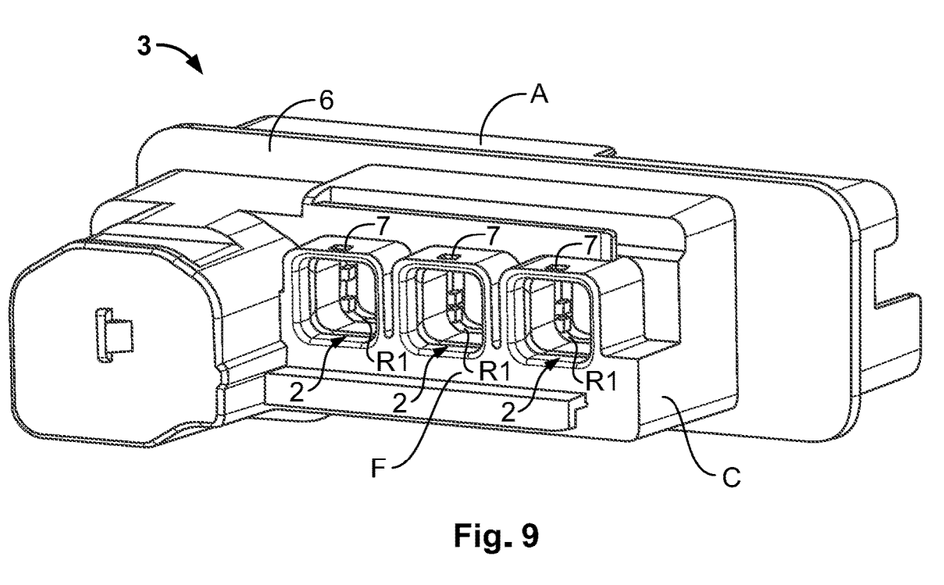
FIG. 9 is another perspective view of the first support body.

The miniaturized connector system also includes an auxiliary portion 2 of the body 10 of the connector element 1, arranged on the extension of the main body 10 of the connector element 1, as shown in FIGS. 11-13. The auxiliary portion 2 defines an extension portion R1 of the receptacle R of the connector element 1. The auxiliary portion 2 of the body of the connector element 1 is an integral part of a portion of the casing 5, separate from the main body 10 of the connector element 1. The auxiliary portion 2 is an integral part of the first support body 3, which supports the printed circuit board P by the previously described grooves S1, S2, S3, S4. More particularly, the auxiliary portion 2 is formed at the rear wall F of the casing 5, as shown in FIGS. 9 and 10. The grooves S1, S2, S3, S4 arranged within the first support body 3 allow the printed circuit board P to be brought into position relative to the auxiliary portion 2 carried by the aforesaid casing portion 5. As previously indicated, the printed circuit board P is arranged within the casing 5 along a horizontal direction, in such a way that its main plane is substantially perpendicular to the front and rear walls E, F of the casing 5.

In one or more embodiments, a terminal 8 of an electric cable may be connected to the printed circuit board P by the miniaturized connector system including the connector element 1 carrying the metal terminals 11 and the auxiliary portion 2, which defines an extension R1 of the receptacle R. To allow locking of the terminal 8 within the receptacle R and its extension R1, the auxiliary portions 2 have respective openings 7, shown in FIG. 11, configured to cooperate with a locking element carried by the terminal 8.

The cross-sectional view of FIG. 13 illustrates the terminal 8, arranged within the receptacle R and its extension R1, and connected to the board P by the metal terminals 11 carried by the connector element 1.

As shown in FIG. 13, a sealing area 13 is formed at the inner surface of the auxiliary portion 2. The sealing area 13 has a profile configured to cooperate with an annular sealing gasket 9 arranged on the cable terminal 8. The sealing area 13 forms a sealed electrical connection, to avoid water infiltrations that could damage the metal terminals 11 of the connector element 1, or other electronic components, compromising the overall operation of the device D. In order to achieve this function effectively, the sealing area 13 is arranged downstream (in the direction of the rear wall F of the casing 5) with respect to the terminals 11 carried by the main body 10 of the connector element 1.

In order to provide simple and intuitive assembly operations for making the device D, the casing 5 of the device D comprises an abutment surface 17, shown in FIGS. 12 and 13, against which the connector element 1 abuts, in the assembled condition of the device D. The abutment surface 17 allows the auxiliary portion 2 of extension R1 of the receptacle R, and the receptacle R of the main body 10 of the connector element 1 to be correctly aligned easily. In the shown embodiment, the abutment surface 17 is defined by a wall arranged within the first support body 3, protruding and directed perpendicularly to the upper wall A of the casing 5, so as to abut against a front portion of the plastic material body of the connector element 1, opposite the bottom wall 14 of the receptacle R.

In the embodiment shown in FIGS. 11-13, three connector elements 1 are arranged side by side with respect to each other, respectively welded to the main side P1 of the printed circuit board P, with the receptacles R having their respective bottom walls 14 directed perpendicularly on the main plane of the printed circuit board P. At the rear wall F of the casing 5 there is a set of three auxiliary portions 2 of the connector elements 1, each arranged on the extension of a respective main body 10 of the connector element 1. In this embodiment example, a set of three terminals 8 of electric cables will be connected to the respective connector elements 1 to make a connection with an electronic control unit, an actuator for locking a mobile recharging connector, mounted on board the motor vehicle with which the present device D is associated and, finally, with a fixed recharging connector.

It will also be appreciated that characteristics or details exemplified with reference to one of the figures described above can also be transposed (individually or in combination with each other) to embodiments exemplified in different figures.

The device D is simple to use and reliable during use, is free from operating anomalies, during the life cycle of a vehicle on which the device is installed, can be assembled and installed on board a motor vehicle by simple and rapid operations, has a relatively simple and low-cost structure designed to reduce the number of components to be produced and assembled, has a compact structure which allows integration of a miniaturized connector system therein, and allows a sealed electrical connection to be obtained, to avoid water infiltration, with a limited number of components.

The present invention also relates to a method for assembling the device D for controlling and/or supplying information on a recharging operation of an electric motor vehicle or a hybrid motor vehicle, comprising the following steps:
  providing a printed circuit board P having a main side P1,
  rigidly connecting on the main side P1 of the board P at least one connector element 1 comprising a main connector body 10 made of plastic material and defining a receptacle R extending along a direction substantially parallel to the main plane of the printed circuit board P, said at least one connector element 1 further comprising at least one metal terminal 11,
  connecting said at least one metal terminal 11 to the printed circuit board P,
  providing an auxiliary portion 2 of the main body 10 of the connector element 1, integrated in a portion 3 of the casing 5, separated from said main body 10 of the connector element 1 defining said receptacle R,
  locking said printed circuit board P into at least one seat S1, S2 S3, S4 formed on said portion 3 of the casing 5, and
  arranging said main body 10 of the connector element 1 in abutment against an abutment surface 17 of said portion 3 of the casing 5,
  connecting a terminal 8 of a cable to the connector element 1, through said auxiliary portion 2, according to an operative connection direction, parallel to the main plane of the printed circuit board P.

Of course, without prejudice to the principle of the invention, the details of construction and the embodiments may vary widely with respect to those described and illustrated purely by way of example, without departing from the scope of the present invention.

What is claimed is:

1. A device for controlling and/or supplying information on a recharging operation of an electric motor vehicle or a hybrid motor vehicle, comprising:
  a casing having a substantially prismatic shape and defining an upper wall, a lower wall, a pair of opposite side walls, a front wall, and a rear wall;
  a printed circuit board mounted within the casing, the casing has a plurality of grooves configured for locking the printed circuit board within the casing along a horizontal direction perpendicular to the front wall; and
  a human-machine interface associated with the casing, the human-machine interface including a push-button switching device having an on/off button, having a push-button body, carrying at least one electric contact, arranged within the casing, and having a portion mounted to the printed circuit board, the push-button switching device has an arm protruding from the push-button body, the arm abuts against an abutment wall arranged within the casing when the on/off button is pressed.

2. The device of claim 1, wherein the abutment of the arm with the abutment wall prevents a stress on the push-button switching device from being transferred onto the printed circuit board.

3. The device of claim 1, wherein the on/off button is arranged at the front wall.

4. The device of claim 3, wherein the push-button body extends within the casing along a direction substantially perpendicular to the front wall and the rear wall.

5. The device of claim 4, wherein the arm protrudes from the push-button body in a direction opposite to the printed circuit board and perpendicularly to a main axis of the push-button body.

6. The device of claim 5, wherein the arm has a plane substantially perpendicular to the abutment wall and, when the on/off is pressed, a side of the arm contacts the abutment wall.

7. The device of claim 1 wherein each of the grooves is defined by a pair of fins including an upper fin and a lower fin vertically spaced from each other.

8. The device of claim 7, wherein the grooves include a pair of end grooves each arranged at an inner surface of a side wall of the casing and a pair of intermediate grooves each arranged at an intermediate wall formed within the casing between the side walls.

9. The device of claim 8, wherein the intermediate grooves both face one of the end grooves and are arranged closer to the rear wall of the casing than the end grooves.

10. The device of claim 8, wherein a central rib is formed between the upper fin and the lower fin defining the end grooves, the central rib extending longitudinally within the end groove to limit a movement of the printed circuit board along a horizontal direction perpendicular to the side walls.

11. The device of claim 8, wherein a pair of triangular ribs are formed between the upper fin and the lower fin defining an end groove and between the upper fin and the lower fin defining an intermediate groove.

12. The device of claim 11, wherein the triangular ribs face each other and are arranged adjacent to the upper fin or the lower fin to limit a movement of the printed circuit board along a direction perpendicular to the front wall.

13. The device of claim 1 wherein the casing has a first support body and a second support body rigidly connected to the first support body.

14. The device of claim 13, wherein the grooves are located within the first support body and the second support body has the front wall that includes the on/off button.

15. The device of claim 14, wherein the first support body has a thickness protruding from a plurality of walls of the first support body along a direction perpendicular to the walls.

16. The device of claim 15, wherein the thickness is arranged joined to a front surface of the second support body to provide a single hollow casing inside which all the components of the device are arranged.

17. The device of claim 13, wherein the abutment wall is formed within the first support body.

18. The device of claim 1, wherein the device is mounted on the motor vehicle and associable with an inlet electric connector assembly for recharging the motor vehicle.

19. A method for assembling a device for controlling and/or supplying information on a recharging operation of an electric motor vehicle or a hybrid motor vehicle, comprising:
  providing a printed circuit board having a main side;
  rigidly connecting on the main side at least one connector element including a main connector body made of a plastic material and defining a receptacle extending along a direction substantially parallel to a main plane of the printed circuit board, the at least one connector element having at least one metal terminal;
  connecting the at least one metal terminal to the printed circuit board;
  providing an auxiliary portion of the main body integrated in a portion of a casing separated from the main body;
  locking the printed circuit board into at least one seat formed on the portion of the casing;
  arranging the main body in abutment against an abutment surface of the portion of the casing; and connecting a terminal of a cable to the connector element through auxiliary portion, according to an operative connection direction, parallel to the main plane of the printed circuit board.

* * * * *